United States Patent
Parkhe

(10) Patent No.: US 11,450,546 B2
(45) Date of Patent: Sep. 20, 2022

(54) SEMICONDUCTOR SUBSTRATE SUPPORT WITH INTERNAL CHANNELS

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 41 days.

(21) Appl. No.: 16/844,134

(22) Filed: Apr. 9, 2020

(65) Prior Publication Data
US 2021/0320023 A1 Oct. 14, 2021

(51) Int. Cl.
  H01L 21/683 (2006.01)
  H01J 37/32 (2006.01)

(52) U.S. Cl.
  CPC .... *H01L 21/6833* (2013.01); *H01J 37/32724* (2013.01)

(58) Field of Classification Search
  CPC .............. H01L 21/6833; H01J 37/32724
  See application file for complete search history.

(56) References Cited

U.S. PATENT DOCUMENTS

| | | | | |
|---|---|---|---|---|
| 7,465,478 B2* | 12/2008 | Collins | ................. | H01J 37/321 427/523 |
| 2012/0091108 A1* | 4/2012 | Lin | ................... | H01L 21/67109 219/201 |
| 2014/0253900 A1* | 9/2014 | Cornelissen | ............ | G03F 7/707 355/72 |
| 2016/0148828 A1* | 5/2016 | Parkhe | .............. | H01L 21/68785 361/234 |
| 2017/0306494 A1 | 10/2017 | Lin et al. | | |
| 2019/0148205 A1* | 5/2019 | Kim | .................. | H01L 21/67103 156/345.33 |

FOREIGN PATENT DOCUMENTS

| | | |
|---|---|---|
| JP | 2014-072355 A | 4/2014 |
| JP | 2015-035447 A | 2/2015 |
| JP | 2017-123396 A | 7/2017 |
| WO | 2013-050243 A1 | 4/2013 |

OTHER PUBLICATIONS

English translation of Kibe (JP 2017123396A) (Year: 2017).*
International Search Report and Written Opinion dated Jul. 19, 2021 in International Patent Application No. PCT/US2021/024562, 8 pages.

* cited by examiner

*Primary Examiner* — Thienvu V Tran
*Assistant Examiner* — Bart Iliya
(74) *Attorney, Agent, or Firm* — Kilpatrick Townsend & Stockton LLP

(57) ABSTRACT

Exemplary substrate support assemblies may include an electrostatic chuck body defining a substrate support surface. The support assemblies may include a support stem coupled with the electrostatic chuck body. The support assemblies may include an electrode embedded within the electrostatic chuck body proximate the substrate support surface. The support assemblies may include a ground electrode embedded within the electrostatic chuck body. The support assemblies may include one or more channels formed within the electrostatic chuck body between the electrode and the ground electrode.

17 Claims, 4 Drawing Sheets

SEMICONDUCTOR SUBSTRATE SUPPORT WITH INTERNAL CHANNELS

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. Substrate supports may play an important role in semiconductor processing, with aspects related to providing temperature control for a substrate, to embedded electrodes utilized for plasma formation within a processing chamber. Coordinating the many related aspects of a semiconductor substrate support may involve competing characteristics and materials. As fabrication outcomes become more sensitive to processing conditions, the aspects of a substrate support may have a significant impact on a number of processing characteristics.

Thus, there is a need for improved systems and methods that can be used to produce high quality devices and structures. These and other needs are addressed by the present technology.

SUMMARY

Exemplary substrate support assemblies may include an electrostatic chuck body defining a substrate support surface. The support assemblies may include a support stem coupled with the electrostatic chuck body. The support assemblies may include an electrode embedded within the electrostatic chuck body proximate the substrate support surface. The support assemblies may include a ground electrode embedded within the electrostatic chuck body. The support assemblies may include one or more channels formed within the electrostatic chuck body between the electrode and the ground electrode.

In some embodiments, the electrostatic chuck body may be a monolithic body of a ceramic material incorporating each of the electrode, the ground electrode, and the one or more channels. The assemblies may include a heater embedded within the electrostatic chuck body between the electrode and the ground electrode. The one or more channels may include a plurality of channels. A first channel of the plurality of channels may be formed within the electrostatic chuck body between the electrode and the heater. A second channel of the plurality of channels may be formed within the electrostatic chuck body between the ground electrode and the heater. A third channel of the plurality of channels may be formed within the electrostatic chuck body between the electrode and the heater vertically offset within the electrostatic chuck body from the first channel of the plurality of channels. The first channel may include a set of first interconnected channels. The channels may include a plurality of first annular channels distributed across a first plane of the electrostatic chuck body. The channels may include a plurality of first channel interconnects distributed radially between each first annular channel of the plurality of first annular channels.

The third channel may include a set of second interconnected channels. The channels may include a plurality of second annular channels distributed across a second plane of the electrostatic chuck body. The second plane of the electrostatic chuck body may be vertically offset from the first plane of the electrostatic chuck body. The channels may include a plurality of second channel interconnects distributed radially between each second annular channel of the plurality of second annular channels. The plurality of second annular channels may be radially offset from the plurality of first annular channels. The plurality of second channel interconnects may be azimuthally offset from the plurality of first channel interconnects. The second channel may include a set of third interconnected channels. The channels may include a plurality of third annular channels distributed across a third plane of the electrostatic chuck body. The third plane of the electrostatic chuck body may be vertically offset from the first plane of the electrostatic chuck body and the second plane of the electrostatic chuck body. The channels may include a plurality of third channel interconnects distributed radially between each third annular channel of the plurality of third annular channels. Each channel of the plurality of third annular channels may be vertically aligned with an associated channel of the plurality of first annular channels. The plurality of second channel interconnects may be azimuthally aligned with the plurality of first channel interconnects. The assemblies may include a fourth channel formed within the third plane of the electrostatic chuck body. The channel may be configured to seat a thermocouple extended through the support stem coupled with the electrostatic chuck body.

Some embodiments of the present technology may encompass substrate support assemblies. The assemblies may include an electrostatic chuck body defining a substrate support surface. The assemblies may include a support stem coupled with the electrostatic chuck body. The assemblies may include an electrode embedded within the electrostatic chuck body proximate the substrate support surface. The assemblies may include a ground electrode embedded within the electrostatic chuck body. The assemblies may include a first set of interconnected channels formed within the electrostatic chuck body between the electrode and the ground electrode. The assemblies may include a second set of interconnected channels formed within the electrostatic chuck body between the electrode and the ground electrode. The second set of interconnected channels may be radially offset from the first set of interconnected channels. The first set of interconnected channels may be maintained at least 5 mm from a radial edge of the electrostatic chuck body. The first set of interconnected channels and the second set of interconnected channels may be maintained at atmospheric pressure.

In some embodiments, an effective capacitance within the electrostatic chuck body between the electrode and the ground electrode may be less than or about 1,000 pF. The electrostatic chuck body may be characterized by a volume percentage of air greater than or about 10%. The assemblies may include a heater positioned between the electrode and the ground electrode. The assemblies may also include a third set of interconnected channels formed within the electrostatic chuck body between the heater and the ground electrode.

Some embodiments of the present technology may encompass substrate support assemblies. The assemblies may include an electrostatic chuck body defining a substrate support surface. The assemblies may include a support stem coupled with the electrostatic chuck body. The assemblies may include an electrode embedded within the electrostatic chuck body proximate the substrate support surface. The assemblies may include a ground electrode embedded within the electrostatic chuck body. The assemblies may include a heater embedded within the electrostatic chuck body between the electrode and the ground electrode. The assemblies may include a first set of interconnected channels formed within the electrostatic chuck body between the electrode and the heater. The assemblies may include a second set of interconnected channels formed within the electrostatic chuck body between the first set of interconnected channels and the heater. The assemblies may include a third set of interconnected channels formed within the electrostatic chuck body between the heater and the ground electrode.

Such technology may provide numerous benefits over conventional systems and techniques. For example, incorporating channels within a substrate support may improve the effective capacitance between embedded electrodes. Additionally, coordination of the channels may allow reduced distance between a hot electrode and a ground electrode while limiting effective capacitance. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
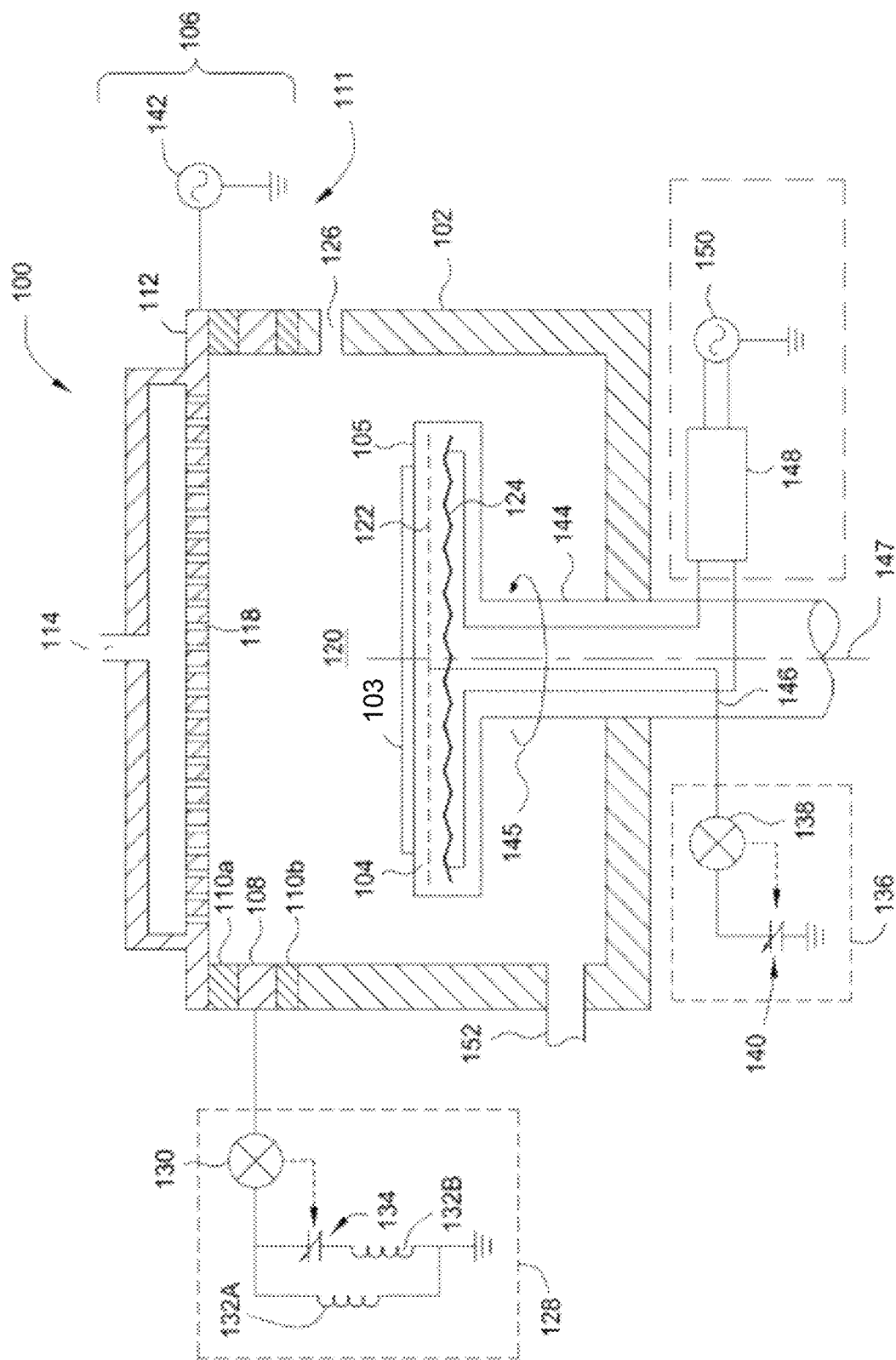
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. An electrostatic chuck may be used to produce a clamping action against the substrate to maintain planarity across the substrate and contact between the substrate and the substrate support. The substrate support may perform multiple functions during plasma processing. For example, in addition to chucking the wafer against the substrate support, the substrate support may include one or more embedded heaters for controlling a temperature of the substrate during processing. Additionally, the substrate support may operate as one of the electrodes for a capacitively-coupled plasma produced within a substrate processing region of the semiconductor processing chamber.

An electrode within the substrate support, as well as an opposing faceplate or showerhead, may operate as two opposing capacitively-coupled electrodes during plasma processing. This may produce a plasma between the components, which may ionize delivered precursors and produce reactants that may deposit materials on the substrate. While the chamber body may be grounded and operate as a ground path in some embodiments, this ground path may cause challenges during processing. The ground path from a hot electrode within the pedestal to the chamber walls may not be symmetric with gap regions around the substrate support and below the substrate support, and electrical fields may create areas of higher distribution, which may ignite stray plasma in regions around the substrate support. To improve issues with asymmetrical grounding, many substrate supports will additionally include a ground electrode within the substrate support itself. The ground electrode within the substrate support may be separated from the plasma-generating electrode within the platen portion of the substrate support, or the electrostatic chuck body. As many substrate supports are a ceramic or dielectric material, shorting between these electrodes may not occur, although electrical losses may be generated through the dielectric body from the hot electrode to the ground electrode.

While improving the symmetry of the ground path and incorporating a ground electrode within the electrostatic chuck body may reduce stray plasma issues, many conventional technologies must accept the electrical losses from the incorporation of a ground electrode within the substrate support. One solution to reduce these losses may include increasing a thickness of the dielectric material, and thus a corresponding distance between the hot electrode and ground electrode, which may reduce the capacitive losses between these two components. However, due to space constraints within the processing chamber, many substrate supports are constrained vertically, which may limit the ability to sufficiently increase the chuck body thickness. The present technology may overcome these issues by manipulating the electrical properties of the ceramic of the ground plate. By including an amount of air or fluid space within the substrate support, an effective capacitance between the hot and ground electrodes may be reduced, while maintaining a specified thickness of the substrate support.

Although the remaining disclosure will routinely identify specific deposition processes and chambers utilizing the disclosed technology, it will be readily understood that the systems and methods are equally applicable to other deposition, etch, and cleaning chambers, as well as processes as may occur in the described chambers. Accordingly, the technology should not be considered to be so limited as for use with these specific deposition processes or chambers alone. The disclosure will discuss one possible chamber that may include substrate support assemblies according to embodiments of the present technology before additional variations and adjustments to this system according to embodiments of the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
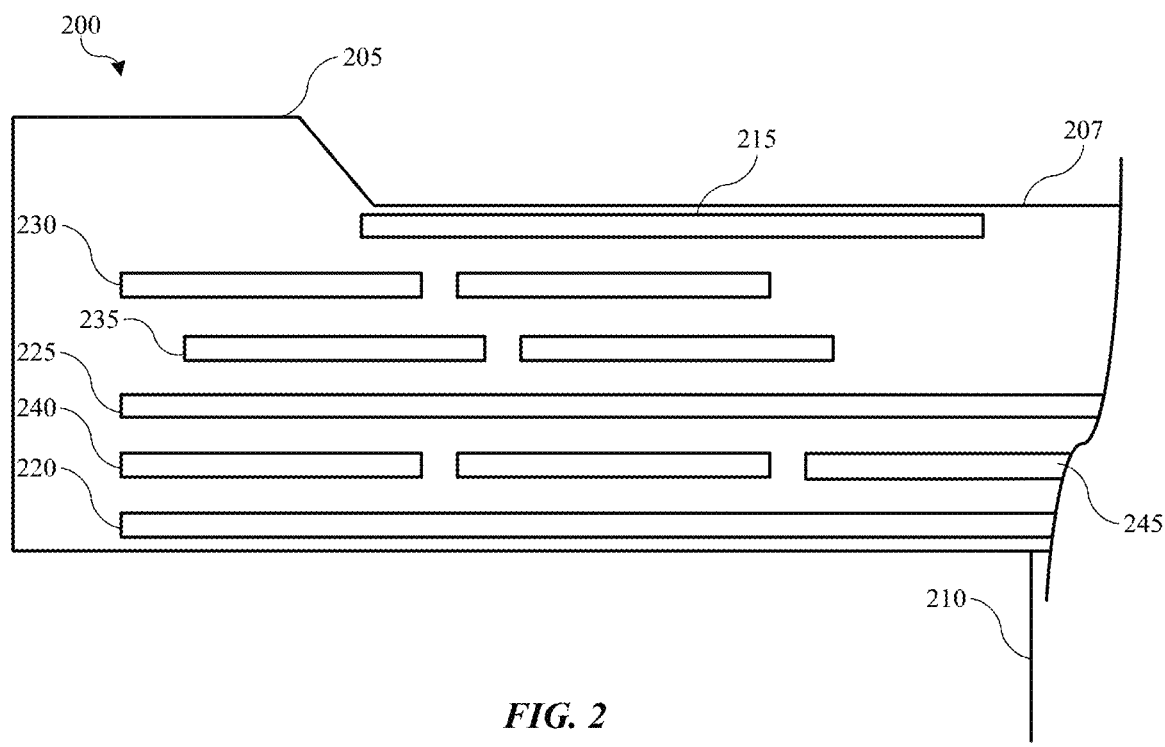
FIG. 2 shows a schematic partial cross-sectional view of an exemplary substrate support assembly according to some embodiments of the present technology.

FIG. 2 shows a schematic partial cross-sectional view of an exemplary substrate support 200 according to some embodiments of the present technology. For example, substrate support 200 may illustrate a portion of substrate support 104 described above, which may include any aspect of that support assembly, and may illustrate additional details of that support assembly. Substrate support 200 may illustrate a simplified cross-section of a support structure, which may include a number of other components or aspects as previously described, or as may be included in substrate supports. It is to be understood that substrate support 200 is not illustrated to any particular scale, and is included merely to illustrate aspects of the present technology. Substrate support 200 may be included within a chamber as previously described, as well as any other processing chamber, which may define a substrate processing region, such as with one or more walls of a chamber body, or other components positioned within the processing chamber. Substrate support 200 may show a partial view of components and couplings within an exemplary semiconductor processing system, and may not include all of the components, such as the chamber components and characteristics previously described, which are understood to be incorporated in some embodiments about and with substrate support 200.

Substrate support 200 may include a number of components bonded, welded, joined, sintered, formed, or otherwise coupled with one another. The substrate support assembly may include an electrostatic chuck body 205, which may include one or more components embedded or disposed within the body. The components incorporated within the top puck may not be exposed to processing materials in some embodiments, and may be fully retained within the chuck body 205. Electrostatic chuck body 205 may define a substrate support surface 207, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 205 may be coupled with a stem 210, which may support the chuck body and may include channels for delivering and receiving electrical and/or fluid lines that may couple with internal components of the chuck body 205. Chuck body 205 may include associated channels or components to operate as an electrostatic chuck, although in some embodiments the assembly may operate as or include components for a vacuum chuck, or any other type of chucking system. Stem 210 may be coupled with the chuck body on a second surface of the chuck body opposite the substrate support surface. The electrostatic chuck body 205 may include an electrode 215 embedded within the chuck body proximate the substrate support surface. Electrode 215 may be electrically coupled with a power source for operating as a plasma-generating electrode alone or with another component, such as with a faceplate or other chamber component for producing a capacitively-coupled plasma above the wafer. The power source may be configured to provide energy or voltage to the electrically conductive chuck electrode 215, which may also operate as a chucking electrode in some embodiments.

In some embodiments the electrostatic chuck body 205 and/or the stem 210 may be insulative or dielectric materials. For example, oxides, nitrides, carbides, and other materials may be used to form the components, as well as a range of polymeric materials, including polystyrene or other materials, including cross-linked materials. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties or other characteristics of the components. Exemplary dopant materials may include yttrium, magnesium, silicon, iron, calcium, chromium, sodium, nickel, copper, zinc, or any number of other elements known to be incorporated within a ceramic or dielectric material.

The chuck body may include a ground electrode 220, which may be disposed proximate the backside of the chuck body, such as proximate the surface with which the stem is coupled. Additionally, a heater 225 may be incorporated within the chuck body, such as between the electrode 215 and the ground electrode 220. Electrical couplings for the heater and electrode may extend through the stem and substrate support to electrically couple the components with power supplies.

In some embodiments, the electrostatic chuck body may also include or define one or more channels within the electrostatic chuck body between the electrode 215 and the ground electrode 220. As explained previously, electrical losses may occur from the electrode 215 to the ground electrode 220 through the electrostatic chuck body 205. In some embodiments a thickness of the chuck body may be fixed, and thus reducing the electrical losses by increasing a distance between the electrodes may not be feasible. Accordingly, in some embodiments the electrical properties of the chuck body may be modified by incorporating gaps, which may include air or some other fluid or gas pumped into the channels.

In addition to increasing the chuck body thickness to further separate the electrodes, increasing air pockets or porosity may reduce the effective capacitance between the two electrodes within the chuck body. To effectively reduce the capacitance, however, a sufficient volume of air or fluid may be included. By increasing porosity throughout the substrate support, however, leakage may occur. For example, the substrate support may be included within a processing chamber that may be operated under vacuum during semiconductor processing. Channels formed within the stem and top puck for delivering fluids or electrical connections may be maintained at atmospheric conditions. When the chuck body is sufficiently porous, the pressure differential between the atmospheric components and the vacuum conditions within the chamber may cause air to leak through the porous body into the processing chamber. Consequently, simply increasing the porosity of the puck body may not allow a sufficient volume of air to be incorporated to effectively reduce capacitance without compromising the operation of the substrate support with respect to processing.

Accordingly, the present technology may include a number of channels formed within the electrostatic chuck body to increase a volume percentage of air or other fluid within the puck between the two electrodes, which may reduce the effective capacitance between the electrodes. The channels may be distributed to limit structural impact on the substrate support. For example, because the electrostatic chuck body may be formed by a high temperature and pressure sintering process, and then operated under potentially high vacuum conditions, forming a single volume within the electrostatic chuck body may cause the structure to collapse during formation or operation. Additionally, heat transfer through the electrostatic chuck body may be greatly impeded with such a volume, which may affect uniformity of heating of a substrate. Consequently, some embodiments of the present technology may include one or more channels within the substrate support distributed to limit mechanical and thermal impact on operation of the substrate support, while improving electrical characteristics of the substrate support.

As illustrated, the electrostatic chuck body may be a monolithic body of a ceramic material incorporating each of the hot electrode, the ground electrode, the heater, and the channels. As will be described further below, the monolith may be formed by sintering or otherwise joining a number of plates, such as green bodies, which may define the one or more channels that in some embodiments may be a plurality of channels. Each channel included may be accessible through the stem, which may allow fluid access, and which may prevent the channels from being sealed volumes within the electrostatic chuck body, for example. A first channel 230 may be formed within the electrostatic chuck body 205 between the electrode 215 and the heater 225. A second channel 235 may be formed within the electrostatic chuck body between the electrode 215 and the heater 225, and may be formed within the chuck body between the first channel 230 and the heater 225. The second channel may be vertically offset within the electrostatic chuck body from the first channel as illustrated.

In some embodiments a third channel 240 may be formed within the electrostatic chuck body between the heater 225 and the ground electrode 220. As will be explained further below, each channel may include or be comprised of a set of interconnected channels, which may all be fluidly coupled to produce a single distributed channel. In embodiments some or all of the channels may be included in substrate support assemblies, although not all channels may be included. For example, in some embodiments only one of the channels may be included, or any two of the channels may be included. In one non-limiting embodiment only the first and third channel may be included, in which case the third channel may constitute a second channel, for example. Any number of inclusions or exclusions is similarly encompassed by embodiments of the present technology.

Each of the channels included may be distributed along a respective plane through the electrostatic chuck body. For example, the first channel may extend along a first plane through the electrostatic chuck body, the second channel may extend along a second plane through the electrostatic chuck body, and the third channel may extend along a third plane through the electrostatic chuck body. Channels may be distributed along the plane to maintain structural support and sufficient heat transfer through the layers of the substrate support. For example, when both first channel 230 and second channel 235 are included, the channels may be offset from one another. As illustrated, in some embodiments second channel 235 may be offset from associated portions of the first channel 230.

Third channel 240 is illustrated as being aligned with first channel 230, although in other embodiments third channel 240 may be aligned with second channel 235, or may be offset from both first channel 230 and second channel 235. In line with third channel 240 may be an additional access 245, which may provide a space for a thermocouple or additional sensor. Additionally, to limit leakage from any of the channels into the chamber environment, which may be a vacuum environment, in some embodiments a radial outermost portion of any channel may be maintained at least about 1 mm from an exterior edge of the substrate support, and may be maintained greater than or about 2 mm from the exterior edge, greater than or about 3 mm, greater than or about 4 mm, greater than or about 5 mm, greater than or about 6 mm, greater than or about 7 mm, greater than or about 8 mm, greater than or about 9 mm, greater than or about 10 mm, or more.

Figure 3:
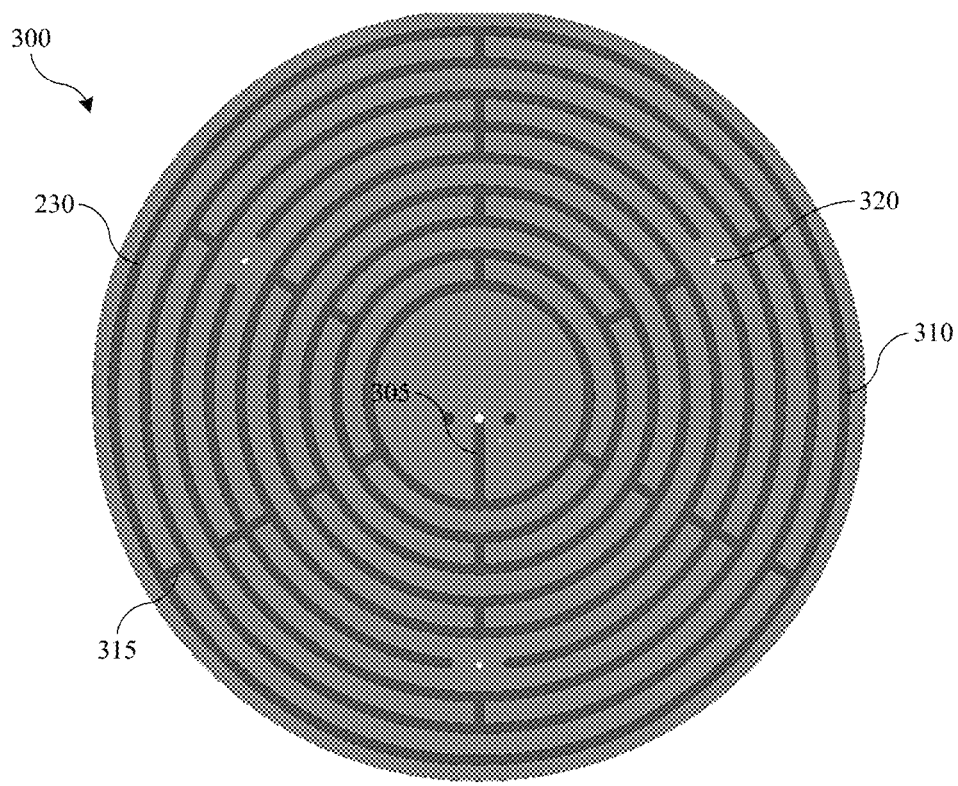
FIG. 3 shows a schematic plan view of a portion of an exemplary substrate support assembly according to some embodiments of the present technology.

As noted previously, electrostatic chuck body 205 may be formed by joining a number of plates that may define the one or more channels. Channels may be formed within molds or green bodies, which may then be sintered together to form a monolithic electrostatic chuck body, which may include the channels and components noted previously. FIG. 3 shows a schematic plan view of a portion of an exemplary substrate support assembly according to some embodiments of the present technology. The figure may show a plan view of a first plate 300, which may be a portion of electrostatic chuck body 205 described above. The plate may include any of the features or characteristics of the chuck body, and may define a first channel 230 within a surface of the plate.

First channel 230 may be a set of interconnected channels formed along the surface of the plate 300. The set of interconnected channels may be fluidly connected throughout the channel, and may form a single continuous pocket within the surface. First channel 230 may include a portion 305 extending to a central access, which may fluidly couple the first channel 230 with the stem 210 of the substrate support, which may allow the first channel to be maintained at atmospheric conditions, or may provide access for a fluid to be pumped or flowed into the channel or from the channel in some embodiments. The interconnected channels of first channel 230 may include a plurality of annular channels 310, or semi-annular channels, formed within the plate. The annular channels 310 may be concentric extending radially outward along the plate. A plurality of channel interconnects 315 may be formed between the annular channels 310, which may fluidly couple the annular channels, and provide fluid communication throughout first channel 230. First channel 230 may extend about one or more apertures 320 formed through the plate, which may provide access for lift pins to extend through the substrate support. Because the lift pins may extend into the vacuum conditions of the chamber, first channel 230, as well as the other channels through the other plates, may not extend through or intersect the apertures to limit any access between the channels and the processing environment.

Figure 4:
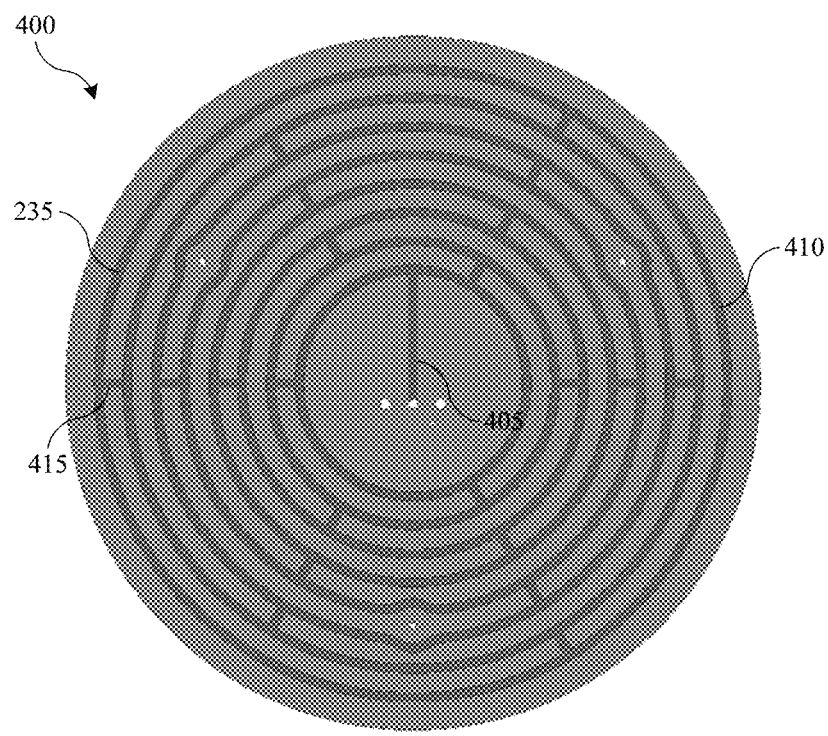
FIG. 4 shows a schematic plan view of a portion of an exemplary substrate support assembly according to some embodiments of the present technology.

FIG. 4 shows a schematic plan view of a portion of an exemplary substrate support assembly according to some embodiments of the present technology. The figure may show a plan view of a second plate 400, which may be a portion of electrostatic chuck body 205 described above. The plate may include any of the features or characteristics of the chuck body, and may define a second channel 235 within a surface of the plate. Plate 400 may include any of the features of first plate 300 described above.

For example, second channel 235 may be a set of interconnected channels formed along the surface of the plate 300, similarly to first channel 230. The set of interconnected channels may be fluidly connected throughout the channel, and may form a single continuous pocket within the surface. Second channel 235 may include a portion 405 extending to a central access, which may fluidly couple the second channel 235 with the stem 210 of the substrate support, which may allow the second channel to be maintained at atmospheric conditions, or may provide access for a fluid to be pumped or flowed into the channel or from the channel in some embodiments. The interconnected channels of second channel 235 may include a plurality of annular channels 410, or semi-annular channels, formed within the plate. The annular channels 410 may be concentric extending radially outward along the plate. A plurality of channel interconnects 415 may be formed between the annular channels 410, which may fluidly couple the annular channels, and provide fluid communication throughout second channel 235.

As illustrated, the annular channels 410 of second plate 400 may be radially offset along a radius of the electrostatic chuck body from the annular channels 310 of first plate 300. This may facilitate both structural support across the substrate support when the plates are joined together, as well as provide improved thermal communication across the plates, which may maintain uniform heating through the plates to limit temperature effects that may otherwise be caused by the formed channels. Additionally, the plurality of second channel interconnects 415 may be azimuthally offset about the second plate from the location about the first plate where the first channel interconnects 315 may be located. This may similarly maintain structural support across a thickness of the substrate support between planes of the chuck body in which channels are formed.

Figure 5:
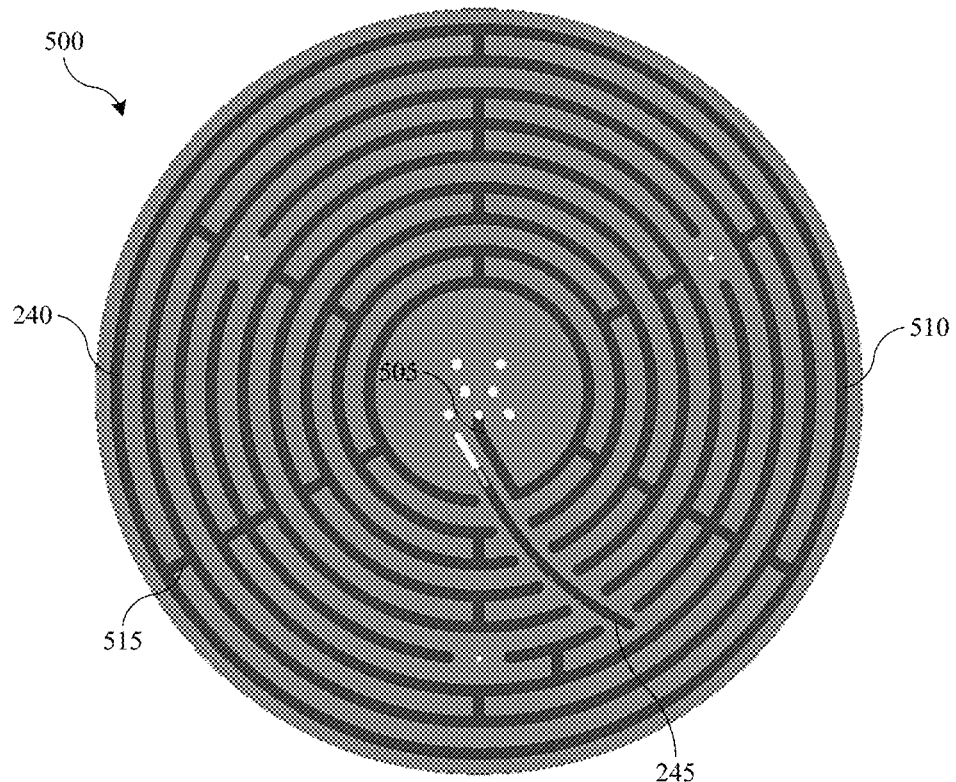
FIG. 5 shows a schematic plan view of a portion of an exemplary substrate support assembly according to some embodiments of the present technology.

FIG. 5 shows a schematic plan view of a portion of an exemplary substrate support assembly according to some embodiments of the present technology. The figure may show a plan view of a third plate 500, which may be a portion of electrostatic chuck body 205 described above. The plate may include any of the features or characteristics of the chuck body, and may define a third channel 240 within a surface of the plate. Plate 500 may include any of the features of first plate 300 or second plate 400 described above.

For example, third channel 240 may be a set of interconnected channels formed along the surface of the plate 500, similarly to first channel 230. The set of interconnected channels may be fluidly connected throughout the channel, and may form a single continuous pocket within the surface. Third channel 240 may include a portion 505 extending to a central access, which may fluidly couple the third channel 240 with the stem 210 of the substrate support, which may allow the third channel to be maintained at atmospheric conditions, or may provide access for a fluid to be pumped or flowed into the channel or from the channel in some embodiments. In some embodiments, each of the portions 305, 405, and 505 may fluidly couple with an aperture extending at least partway through the substrate support, although the aperture may not fully extend through a substrate support surface of the substrate support, to limit any interaction with a processing environment, such as vacuum conditions. The interconnected channels of third channel 240 may include a plurality of annular channels 510, or semi-annular channels, formed within the plate. The annular channels 510 may be concentric extending radially outward along the plate. A plurality of channel interconnects 515 may be formed between the annular channels 510, which may fluidly couple the annular channels, and provide fluid communication throughout third channel 240.

As illustrated, the annular channels 510 of third plate 500 may be radially aligned along a radius of the electrostatic chuck body with the annular channels 310 of first plate 300. Additionally, the plurality of second channel interconnects 515 may be azimuthally aligned about the second plate with the location about the first plate where the first channel interconnects 315 may be located. Although some embodiments as illustrated may include this interconnect arrangement, because third channel 240 may be further removed from first channel 230 and second channel 235, in some embodiments third channel 240 may be formed in a variety of arrangements. For example, in some embodiments third channel 240 may be formed with one or more of the annular channels 510 or the channel interconnects 515 being aligned with associated aspects of the second channel 235.

Additionally, in some embodiments third channel 240 may be formed with one or more of the annular channels 510 or the channel interconnects 515 being offset from associated aspects of the second channel 235 and the first channel 230, such that the interconnects of each channel are azimuthally offset from the interconnects of any other channel, and/or that each of the annular channels 510 may be radially offset from the annular channels of any other channel. Third plate 500 may also define an additional access 245, within which a thermocouple may be seated during operation. Access 245 may be a fourth channel or recess formed within the third plate 500, and may extend from a central aperture of the third plate radially outward along the plate. As illustrated access 245 may not intersect any portion of third channel 240 in some embodiments.

Any of the plates may be characterized by a thickness of the plate as well as a depth of the channel formed within the plate. Although the plates may be of any particular size, in some embodiments, the channels may extend at least 25% of the thickness through the plate, and may extend a depth into the plate of greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, greater than or about 80%, or more, although in some embodiments the channels may not extend fully through the plate.

Figure 6:
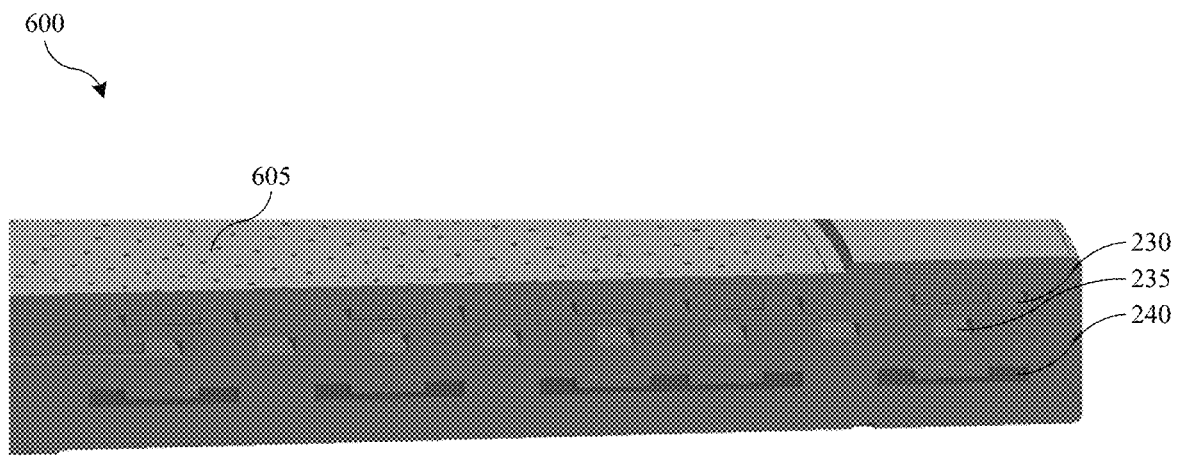
FIG. 6 shows a schematic partial cross-sectional view of an exemplary substrate support assembly according to some embodiments of the present technology.

Turning to FIG. 6 is shown a schematic partial cross-sectional view of an exemplary substrate support 600 according to some embodiments of the present technology, and which may illustrate the channels. Substrate support 600 may include any feature, characteristic, or aspect of any component previously described, and may illustrate further detail of substrate support 200 described above. For example, substrate support 600 may include an electrode, a heater, and a ground electrode as discussed with respect to substrate support 200, and may illustrate channels formed through the chuck body as previously described.

As illustrated, substrate support 600 may show a portion of an electrostatic chuck body 605 in which a number of channels are defined. The substrate support may include a first channel 230, a second channel 235, and a third channel 240, as well as any of the variations discussed previously and similarly encompassed by the present technology. As noted above, when plates are sintered, bonded, or otherwise joined to produce the chuck body 605, the channels may be aligned to maintain structural support throughout the chuck body, as well as to maintain adequate heat transfer through the support. For example, each annular channel of second channel 235 may be radially offset from the annular channels of first channel 230. This particular cross-sectional view may extend along channel interconnects of first channel 230, which may illustrate that channel interconnects of second channel 235 are azimuthally offset from the channel interconnects of first channel 230. Third channel 240 is shown with alignment to the first channel 230 both radially for the annular channels and azimuthally for the channel interconnects fluidly coupling the annular channels.

When the plates are joined, which may include additional plates on either or both sides of the plates defining the channels to produce the complete electrostatic chuck body, a thickness of the chuck body may be defined. Although chuck bodies may be characterized by any thickness in embodiments of the present technology, in some embodiments the electrostatic chuck body may maintain a distance between a hot electrode and a ground electrode of less than or about 30 mm, and may maintain a distance between the electrodes of less than or about 25 mm, less than or about 20 mm, less than or about 18 mm, less than or about 16 mm, less than or about 14 mm, less than or about 12 mm, less than or about 10 mm, or less. As the distance between the electrodes decreases, the effective capacitance between them may increase, causing losses within the system.

However, by incorporating channels which may produce fluid or air volume within the chuck body, the effective capacitance may be reduced. Hence, with electrode spacing within any of the noted ranges, an effective capacitance through the chuck body may be less than or about 1,000 pF, and may be less than or about 980 pF, less than or about 960 pF, less than or about 950 pF, less than or about 940 pF, less than or about 930 pF, less than or about 920 pF, less than or about 910 pF, less than or about 900 pF, less than or about 890 pF, less than or about 880 pF, less than or about 870 pF, less than or about 860 pF, less than or about 850 pF, less than or about 840 pF, less than or about 830 pF, less than or about 820 pF, less than or about 810 pF, less than or about 800 pF, less than or about 790 pF, or less. This may occur by increasing the volume percentage of air within the chuck body by incorporating channels as previously described. For example, in some embodiments, the volume percentage of air within the electrostatic chuck body may be greater than or about 2%, and may be greater than or about 4%, greater than or about 6%, greater than or about 8%, greater than or about 10%, greater than or about 12%, greater than or about 14%, greater than or about 16%, greater than or about 18%, greater than or about 20%, or more. As previously described, this volume percentage may not be the result of increased porosity, which at these ranges may produce air leaks through the chuck body. Consequently, electrostatic chuck bodies according to embodiments of the present technology may be characterized by an effective capacitance similar to a chuck body with electrode spacing that may be up to twice the distance or more.

Figure 7:
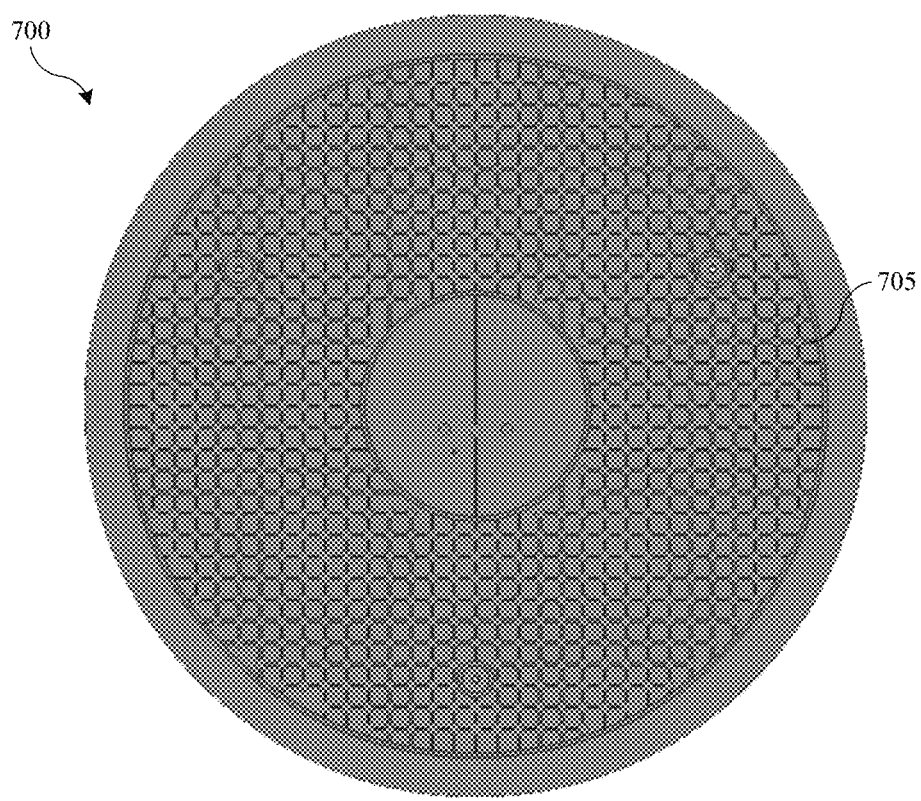
FIG. 7 shows a schematic plan view of a portion of an exemplary electrostatic chuck body according to some embodiments of the present technology.

FIG. 7 shows a schematic plan view of a portion of an exemplary electrostatic chuck body 700 according to some embodiments of the present technology. The chuck body may be included with any system and may be substituted with chuck body 205, or any other component. Electrostatic chuck body 700 may include a set of channels 705 within a single layer through the chuck body to produce a percentage air volume as discussed above. The channels 705 may be fluidly accessible from a central aperture as previously described, and may be formed between a heater and hot electrode as discussed above. The channels 705 may be formed recessed from an exterior edge of the substrate support to maintain fluid isolation with a processing region of a chamber in which the substrate support may be disposed. A top portion of a substrate support, such as including a hot electrode and a substrate support surface may be joined, bonded, or sintered to the chuck body 700, and a stem may be coupled with a backside surface, to produce a substrate support assembly, which may include any of the components, features, or characteristics described above. By utilizing chuck bodies according to embodiments of the present technology, improved electrical performance may be afforded while maintaining dimensional characteristics of substrate supports.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly comprising:
an electrostatic chuck body defining a substrate support surface;
a support stem coupled with the electrostatic chuck body;
an electrode embedded within the electrostatic chuck body proximate the substrate support surface;
a ground electrode embedded within the electrostatic chuck body;
a heater embedded within the electrostatic chuck body between the electrode and the ground electrode; and
one or more channels formed within the electrostatic chuck body between the electrode and the ground electrode, wherein:
each of the one or more channels is fluidly isolated from the substrate support surface; and
a first channel of the one or more channels is formed within the electrostatic chuck body between the ground electrode and the heater.

2. The substrate support assembly of claim 1, wherein the electrostatic chuck body comprises a monolithic body of a ceramic material incorporating each of the electrode, the ground electrode, and the one or more channels.

3. The substrate support assembly of claim 1, wherein the one or more channels comprises a plurality of channels, wherein a second channel of the plurality of channels is formed within the electrostatic chuck body between the electrode and the heater.

4. The substrate support assembly of claim 3, wherein a third channel of the plurality of channels is formed within the electrostatic chuck body between the electrode and the heater vertically offset within the electrostatic chuck body from the second channel of the plurality of channels.

5. The substrate support assembly of claim 4, wherein the second channel comprises a set of first interconnected channels comprising:
a plurality of first annular channels distributed across a first plane of the electrostatic chuck body, and
a plurality of first channel interconnects distributed radially between each first annular channel of the plurality of first annular channels.

6. The substrate support assembly of claim 5, wherein the third channel comprises a set of second interconnected channels comprising:
a plurality of second annular channels distributed across a second plane of the electrostatic chuck body, wherein the second plane of the electrostatic chuck body is vertically offset from the first plane of the electrostatic chuck body, and
a plurality of second channel interconnects distributed radially between each second annular channel of the plurality of second annular channels.

7. The substrate support assembly of claim 6, wherein the plurality of second annular channels are radially offset from the plurality of first annular channels, and wherein the plurality of second channel interconnects are azimuthally offset from the plurality of first channel interconnects.

8. The substrate support assembly of claim 6, the first channel comprises a set of third interconnected channels comprising:
a plurality of third annular channels distributed across a third plane of the electrostatic chuck body, wherein the third plane of the electrostatic chuck body is vertically offset from the first plane of the electrostatic chuck body and the second plane of the electrostatic chuck body, and
a plurality of third channel interconnects distributed radially between each third annular channel of the plurality of third annular channels.

9. The substrate support assembly of claim 8, wherein each channel of the plurality of third annular channels is vertically aligned with an associated channel of the plurality of first annular channels, and wherein the plurality of second channel interconnects are azimuthally aligned with the plurality of first channel interconnects.

10. The substrate support assembly of claim 8, further comprising:
a fourth channel formed within the third plane of the electrostatic chuck body, and configured to seat a thermocouple extended through the support stem coupled with the electrostatic chuck body.

11. A substrate support assembly comprising:
an electrostatic chuck body defining a substrate support surface;
a support stem coupled with the electrostatic chuck body;
an electrode embedded within the electrostatic chuck body proximate the substrate support surface;
a ground electrode embedded within the electrostatic chuck body;
a heater embedded within the electrostatic chuck body between the electrode and the ground electrode;
a first set of interconnected channels formed within the electrostatic chuck body between the electrode and the ground electrode; and
a second set of interconnected channels formed within the electrostatic chuck body between the electrode and the ground electrode; and a third set of interconnected channels formed within the electrostatic chuck body between the heater and the ground electrode, wherein the third set of interconnected channels is fluidly isolated from the substrate support surface.

12. The substrate support assembly of claim 11, wherein the second set of interconnected channels are radially offset from the first set of interconnected channels.

13. The substrate support assembly of claim 11, wherein the first set of interconnected channels are maintained at least 5 mm from a radial edge of the electrostatic chuck body.

14. The substrate support assembly of claim 11, wherein the first set of interconnected channels and the second set of interconnected channels are maintained at atmospheric pressure.

15. The substrate support assembly of claim 14, wherein an effective capacitance within the electrostatic chuck body between the electrode and the ground electrode is less than or about 1,000 pF.

16. The substrate support assembly of claim 11, wherein the electrostatic chuck body is characterized by a volume percentage of air greater than or about 10%.

17. A substrate support assembly comprising:
an electrostatic chuck body defining a substrate support surface;
a support stem coupled with the electrostatic chuck body;
an electrode embedded within the electrostatic chuck body proximate the substrate support surface;
a ground electrode embedded within the electrostatic chuck body;
a heater embedded within the electrostatic chuck body between the electrode and the ground electrode;
a first set of interconnected channels formed within the electrostatic chuck body between the electrode and the heater;
a second set of interconnected channels formed within the electrostatic chuck body between the first set of interconnected channels and the heater; and
a third set of interconnected channels formed within the electrostatic chuck body between the heater and the ground electrode, wherein each of the first set of interconnected channels, the second set of interconnected channels, and the third set of interconnected channels is fluidly isolated from the substrate support surface.

* * * * *